United States Patent
Ohsaki et al.

[11] Patent Number: 5,989,305
[45] Date of Patent: Nov. 23, 1999

[54] FEEDER OF A SOLID ORGANOMETALLIC COMPOUND

[75] Inventors: Hiromi Ohsaki; Toshinobu Ishihara; Isao Kaneko; Kouhei Sato, all of Kubiki-mura, Japan

[73] Assignee: Shin-Etsu Chemical Co., Ltd., Tokyo, Japan

[21] Appl. No.: 08/613,241

[22] Filed: Mar. 8, 1996

[30] Foreign Application Priority Data

Mar. 9, 1995 [JP] Japan ................................. 7-078164

[51] Int. Cl.$^6$ ................................................. H01L 21/00
[52] U.S. Cl. ........................ 75/304; 75/252; 118/726; 34/576
[58] Field of Search ...................... 118/726; 75/252, 75/304; 34/576

[56] References Cited

U.S. PATENT DOCUMENTS

| | | | |
|---|---|---|---|
| 4,916,828 | 4/1990 | Yamane et al. | 34/10 |
| 5,019,423 | 5/1991 | Hiai et al. | 118/726 |

*Primary Examiner*—Melvyn Andrews
*Attorney, Agent, or Firm*—Townsend & Banta

[57] ABSTRACT

A feeder of a solid organometallic compound is obtained by filling a container up to 50–80 vol % of the total capacity of the container with stainless steel support whose pore ratio is adjusted to 50–80 vol % and then also filling it with solid granules of an organometallic compound which is solid at room temperature.

3 Claims, 2 Drawing Sheets

FEEDER OF A SOLID ORGANOMETALLIC COMPOUND

RELATED APPLICATION

This application claims the priority of Japanese Patent application No.7-78164 filed on Mar. 9, 1995.

BACKGROUND OF THE INVENTION

1. Field of the Invention

This invention relates in general to a feeder of an organometallic compound which is solid at room temperature and a method of manufacturing it, and more particularly to a feeder which can supply the organometallic compound which is solid at room temperature without waste and at a stable concentration over an extended period of time, and useful as a material for epitaxial growth by means of the MOCVD (Metalorganic Chemical Vapor Deposition) method for manufacturing compound semiconductors, as well as a method of manufacturing this feeder.

2. The Prior Art

In recent years, the compound semiconductors of the III–V group and II–VI group in the periodic table have been employed in a wide variety of technical fields including semiconductor light emitting elements and microwave transistors. Further, these compound semiconductors have been used in integrated circuits for high speed computers, integrated circuits for optoelectronics and such due to their superior characteristics.

The compound semiconductors used in these diversified applications are manufactured with the MOCVD method for growing the crystals using organometallic compounds. The MOCVD method is one of the crystal growth methods often used to form an epitaxial thin film of a compound or mixed crystal semiconductor. In the MOCVD method, an organometallic compound such as trimethyl indium, trimethel aluminum or trimethyl gallium is used, and the crystal growth of the thin film is carried out by utilizing the thermal decomposition of the source material.

These organometallic compounds used in the MOCVD method a re usually filled in a hermetic container which has two outputs for feeding and discharging gas. A carrier gas such as hydrogen is fed into the container through the feeding output and the carrier gas saturated with vapor of the organometallic compound is obtained from the discharging output.

In general, the organometallic compound which is solid at room temperature is filled in the container where the organometallic compound is adhered to the inner wall of the container as a granular form. However, it is difficult to supply the solid organometallic compound at a constant concentration in the carrier gas. In more detail, since it is difficult to maintain a homogeneous contact between the carrier gas and the solid organometallic compound, the contact area changes. As a result, it is diffficult to feed the solid organometallic compound at a constant concentration.

The electrical and optical characteristics of an intermetallic compound which is formed by epitaxially growing an organometallic compound are significantly affected when the composition ratio of the solid organometallic compound changes during the growth. Therefore, in order to obtain high performance semiconductor elements, it is necessary to supply the organometallic compound steadily at a constant concentration. Also, feeding of the solid organometallic compound is required to be achieved by using only a vaporization container without a complex apparatus.

Particularly, when a solid organometallic compound such as trimethyl indium is fed by the same container as one used for liquid organometallic compounds by the bubbling method in which the carrier gas is bubbled, the feeding rate of solid organometallic compounds changes, depending on the amount of the organometallic compound in the container. As a result, it is difficult to feed the organometallic compound under constant conditions until it runs out.

There have been proposed several methods to solve these problems until now. One of which has proposed that an organometallic compounds is supported by solid support filled in a container (Japanese examined patent publication Tokko Hei 6-20051), and another has proposed that an organometallic compounds is coated on a solid support filled in a container (Japanese unexamined patent publication Tokkai Hei 1-265511).

However, in the first mentioned method, stability in the concentration of the organometallic compounds is not sufficiently improved and the concentration may gradually decrease. In the second mentioned method, it is also difficult to feed the organometallic compounds for a long duration at a constant concentration. Further, the concentration of the organometallic compounds in the carrier gas may not effeciently increase even if the amount of the organometallic compounds coated on the solid support increases unless the amount of the support as well as the organometallic compounds increases. Therefore, a large container is required to contain more solid support, which is not an economical way.

BRIEF SUMMARY OF THE INVENTION

The object of the invention is to provide a feeder of an organometallic compound which is solid at room temperature which can supply the organometallic compounds to an apparatus for epitaxial growth, as well as a method of manufacturing the feeder.

The invention in one aspect provides a feeder of a solid organometallic compound comprises a container filled up to 50–80 vol % of the total capacity of said container with stainless steel support whose pore ratio is adjusted to 50–80 vol %, and solid granules of an organometallic compound which is solid at room temperature filled in said container.

The amount of the filled organometallic compound may be more than 100 weight parts for 100 weight parts of the stainless steel support.

The organometallic compound may be trimethyl indium.

The invention in the other aspect provides a method of manufacturing a feeder of a solid organometallic compound comprises the steps of filling up a container to 50–80 vol % of the total capacity of said filling container with stainless steel support whose pore ratio is adjusted to 50–80 vol %, putting in an organometallic compound which is solid at room temperature, melting the organometallic compound in the container by heating said container to the melting point of said organometallic compound or higher, and cooling said container while rotating it to fill the inside of the container with solid granules of said organometallic compound.

The rotating speed of the container when cooling may be 50–100 rpm.

DETAILED DESCRIPTION

The present invention is further described in details below.

Figure 1:
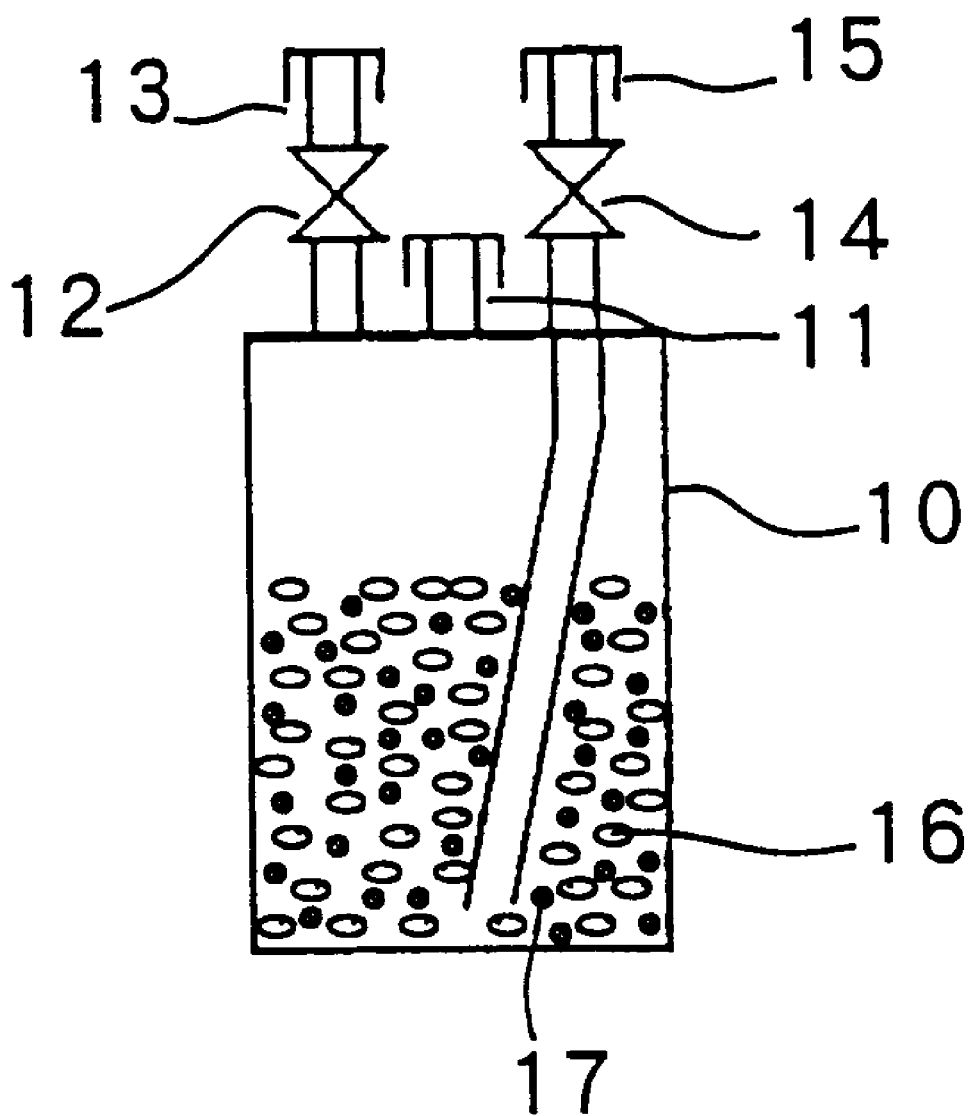
FIG. 1 is a cross section which shows an example of a feeder of a solid organometallic compound according to the present invention.

FIG. 1 shows an example of a feeder of a solid organometallic compound according to the present invention. A container 10 has an output 11, an output 13 with a valve 12 and an output 15 with a valve 14. This container 10 is filled up to 50–80 vol % of the total capacity of said container with stainless steel support 16 whose pore ratio is adjusted to 50–80 vol % and then also filled with a granular organometallic compound 17 which is solid at room temperature.

The stainless steel support 16 is prepared by rolling wire nets of 100-mesh into small diameter cylinders, cutting them into 3 mm-long pieces with a diameter of 3 mm, and adjusting the pore ratio to 50–80 vol % by pressing and crushing them in a radial direction. The stainless steel support with the pore ratio less than 50 vol % cannot support an adequate amount of the organometallic compound, resulting in an uneconomical practice. The stainless steel support with the pore ratio more than 80 vol % is difficult to adhere the organometallic compounds adequately when granulation is done by rotating the container 10, and therefore diffusion of the organometallic compound in the container is inadequate, making it difficult to feed the organometallic compounds at a stable concentration.

The stainless steel support 16 is filled into the container such that it occupies 50–80 vol % of the total capacity of the container. The amount of the organometallic compound may be reduced as well if the filling ratio is less than 50 vol %, and it would be uneconomical. The stainless steel support 16 may not move enough when granulation is done by rotating the container 10 if the filling ratio is more than 80 vol %, and it would not be possible to obtain the granular organometallic compound with desired functionality.

An example of the organometallic compound which is solid at room temperature is trimethyl indium. It is desirable to fill more than 100 weight parts of the organometallic compound for 100 weight parts of the stainless steel support. If it is less than 100 weight parts, then desired functionality will not be obtained and it is difficult to feed the organometallic compound at a stable concentration for a long period of duration. Also, the amount of the organometallic compound in relation to the capacity of the container 10 will become smaller, resulting in an uneconomical and hence undesirable practice.

Next, an example of the method of manufacturing the feeder of a solid organometallic compound is described below. First, the nozzle 11 of the container 10 which is thoroughly cleaned is opened and the stainless steel support 16 is put into it. After closing the output 11, the inside space of the container 10 is replaced with an inert gas. The inert gas may be introduced preferably after reducing the inside pressure below 10 torr. This operation may be repeated 2–3 times to make sure there are no impurities such as oxygen remaining in the system.

The organometallic compound is then put into the container 10 through the output 11, under the inert gas atmosphere. More preferably, introduction of the organometallic compound into the container may include the steps of connecting the output 13 with another container filled with the organometallic compound, replacing the connection space thoroughly with the inner gas, opening the valve 12 to introduce the prescribed amount of the organometallic compound by means of sublimation. As mentioned before, the amount of the organometallic compound is preferably more than 100 weight parts for 100 weight parts of the stainless steel support. Desired functionality will not be obtained when granulation of the organometallic compound is done by rotating the container 10 if the amount of the organometallic compound is 100 weight parts or less for 100 weight parts of the stainless steel support.

The container 10 is then heated up to the melting point of the organometallic compound or higher, by putting the container 10 into an oil bath, a thermostatic bath and such, for example. The container 10 may be heated up to 90–110° C. when the organometallic compound is trimethyl indium.

After heated to the prescribed temperature, the container 10 is cooled while it is rotated to fill the container 10 with the granular organometallic compound 17, which is the solidified organometallic compound. Then, rotation of the container 10 is done by using a pot mill rotating table and such. The container 10 is secured in an cylindrical container and the cylindrical container is rotated on the rotating table while the container 10 is being cooled. The rotating speed may be preferably 50–100 rpm. The organometallic compound segregates near the outer circumference of the inside of the container 10 and the desired characteristics cannot be obtained if the rotating speed is lower than 50 rpm or higher than 100 rpm. The container 10 may be cooled naturally as it rotates, though it can be cooled by cooling means.

The feeder of the solid organometallic compound configured as described above can supply an organometallic compound which is solid at room temperature at a stable concentration and useful as the material for epitaxial growth and without waste for an extended period of time. This is because the organometallic compound in a solid granular form fills the inside of the filling container in an adequately diffused manner.

EXAMPLES

The details of this invention are described below by referring to specific examples.

Example 1

Stainless steel wire nets of 100-mesh was cut into 3 mm×15 mm pieces, and then rolled to have a diameter of approximately 3 mm. 100 g of these pieces were crushed in the radial direction to have a pore ratio of approximately 70 vol % and used for the stainless steel support 16, who's volume was approximately 150 ml.

The container 10 with a outer diameter of 60.5 mm, a main body height of 115 mm and an internal volume of 200 ml, as shown in FIG. 1, was thoroughly rinsed with water and dried. The output 11 was then opened and 100 g of the aforementioned stainless steel support 16 was filled into the container 10. After closing the output 11, a vacuum pump was connected to the output 13 and the pressure in the container 10 was reduced down to 0.1 torr. Helium gas was then introduced through the output 15 to be replaced with. After repeating this operation 3 times, the output 13 was connected to a container containing trimethyl indium, the valve 12 was opened, and the container 10 was filled with the organometallic compound by sublimation. The amount of the organometallic compound was 110 g.

The container 10 was heated up to 100° C. by immersing in an oil bath and kept at this temperature for 0.5 hours. The container 10 was then taken out and secured in a cylindrical container. The cylindrical container was placed on a pot mill rotating table and the container 10 was rotated at 60 rpm for 3 hours. The container 10 was then taken out. The feeder of the solid organometallic compound was thus prepared.

Figure 2:
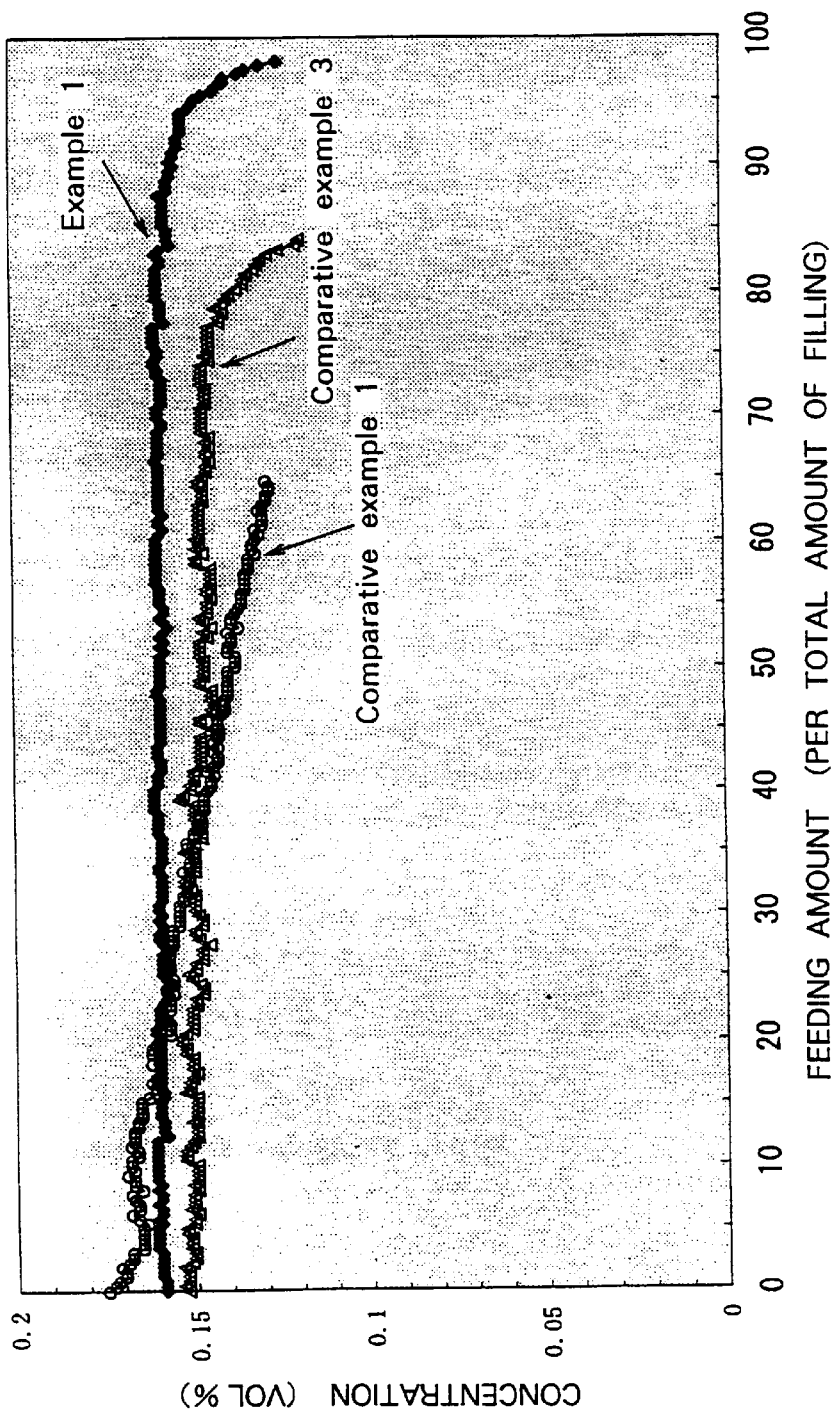
FIG. 2 is a graph which shows changes in the concentration of the organometallic compound fed in gas phase from the feeder of the solid organometallic compound.

A testing was conducted to ascertain if stable feeding of the organometallic compound is possible using this feeder. First, the container 10 containing trimethyl indium was installed in a thermostatic bath and high purity helium was fed through the output 13 to this container 10 to gasify trimethyl indium. The gas phase obtained through the output 15 was measured using a gas concentration meter (from A PRIORI Co., Ltd.). FIG. 2 shows the relationship between the feeding amount (ratio of trimethyl indium to the total amount filled) and the concentration of trimethyl indium. As shown in FIG. 2, the feeder of this example demonstrated the ability to feed trimethyl indium at a stable concentration for an extended period of time and thus its superior stability was confirmed.

Example 2

The organometallic compound was prepared in the same manner as in Example 1 except for the fact that the filled amount of the organometallic compound was 120 g for 100 g of the stainless steel support. A testing was conducted in the same manner as in Example 1. The results were very similar to those for Comparative Example 1 and indicated that this preparation could not be used over an extended period of time.

Comparative Example 1

The organometallic compound was prepared in the same manner as in Example 1 except for the fact that the heating, melting and rotation treatments were not conducted. A testing was conducted in the same manner as in Example 1. The results, as shown in FIG. 2, indicated that this preparation could not be used over an extended period of time.

Comparative Example 2

The organometallic compound was prepared in the same manner as in Example 1 except for the fact that the filled amount of the organometallic compound was 50 g for 100 g of the stainless steel support. A testing was conducted in the same manner as in Example 1. The results were very similar to those for Comparative Example 1 and indicated that this preparation could not be used over an extended period of time.

Comparative Example 3

The organometallic compound was prepared in the same manner as in Example 1 except for the fact that commercial Dickson packing (pore ratio: approximately 94 vol %) was used instead of the stainless steel support adjusted to have a pore ratio of approximately 70 vol %. A testing was conducted in the same manner as in Example 1. The results, as shown in FIG. 2, indicated that this preparation lacked stability and could not be used over an extended period of time.

Comparative Example 4

The organometallic compound was prepared in the same manner as in Example 1 except for the fact that the cylindrical container was rotated at 150 rpm for 3 hours. A testing was conducted in the same manner as in Example 1. The results were very similar to those for Comparative Example 3 and indicated that this preparation lacked stability and could not be used over an extended period of time.

Comparative Example 5

The organometallic compound was prepared in the same manner as in Example 1 except for the fact that the filled amount of the organometallic compound was 100 g for 100 g of the stainless steel support. A testing was conducted in the same manner as in Example 1. The results were very similar to those for Comparative Example 1 and indicated that this preparation could not be used over an extended period of time.

What is claimed is:

1. A feeder of a solid organometallic compound comprising a container, wherein 50–80 vol % of the total capacity said container is filled with stainless steel support having pores, with a pore ratio which is adjusted to 50–80 vol % by pressing and crushing said solid stainless steel support, and solid granules of an organometallic compound which is solid at room temperature filled in said container.

2. The feeder of a solid organometallic compound of claim 1 wherein the amount of said solid organometallic compound, which is solid at room temperature, is more than 100 weight parts for 100 weight parts of the stainless steel support.

3. A feeder of a solid organometallic compound of claim 1 wherein the organometallic compound which is solid at room temperature is trimethyl indium.

* * * * *